United States Patent
Desrosiers et al.

(10) Patent No.: US 6,434,199 B1
(45) Date of Patent: Aug. 13, 2002

(54) $2^N$-QAM MACROCELL

(75) Inventors: Ryan M. Desrosiers, Redondo Beach; Craig A. Hornbuckle, Torrance, both of CA (US)

(73) Assignee: TRW Inc., Redondo Beach, CA (US)

( * ) Notice: Subject to any disclaimer, the term of this patent is extended or adjusted under 35 U.S.C. 154(b) by 0 days.

(21) Appl. No.: 09/175,790

(22) Filed: Oct. 20, 1998

(51) Int. Cl.⁷ .............................. H03C 7/02; H03C 3/00; H04L 27/20
(52) U.S. Cl. ........................ 375/261; 375/259; 332/103; 332/104
(58) Field of Search ................................ 375/261, 260, 375/298, 295, 317, 355, 356, 359, 365, 259; 332/103, 104

(56) References Cited

U.S. PATENT DOCUMENTS

| | | | |
|---|---|---|---|
| 5,442,583 A | * 8/1995 | Kirk et al. | 364/841 |
| 5,451,913 A | * 9/1995 | Dydyk et al. | 332/103 |
| 5,453,720 A | * 9/1995 | McCullough et al. | 332/103 |
| 5,714,911 A | * 2/1998 | Gilbert | 331/57 |
| 5,760,645 A | * 6/1998 | Comte et al. | 329/304 |
| 6,002,723 A | * 12/1999 | Chethik | 375/317 |
| 6,104,244 A | * 8/2000 | Gilbert | 330/267 |
| 6,122,497 A | * 9/2000 | Gilbert | 455/333 |
| 6,163,230 A | * 12/2000 | Lapierre et al. | 332/103 |

FOREIGN PATENT DOCUMENTS

FR  WO-98/38730  * 9/1998

OTHER PUBLICATIONS

Dwight C. Streit et al., "InP HBT Technology and Applications", 10th International Conference on Indium Phosphide and Related Materials, IEEE 1998, May 1998, pp. 64–67.*

K.W. Hobayashi et al., "All–active monolithic InP–based HNT VCO with tunable HEMT inductor", Electronics Letters, vol. 33, No. 16, pp. 1379–1380, Jul. 31, 1997.*

(List continued on next page.)

*Primary Examiner*—Chi Pham
*Assistant Examiner*—Dung X. Nguyen
(74) *Attorney, Agent, or Firm*—Katten Muchin Zavis Rosenman

(57) ABSTRACT

A $2^N$-QAM macrocell for generating constellations with $2^N$ symbols, where N is the number of bits in the digital data word $[D_0:D^{N-1}]$ applied to the macrocell. Since the digital data word is applied directly to the macrocell, the need for a digital mapping chip is thus eliminated thus reducing the complexity and power consumption of the circuit. An important aspect of the invention is that the $2^N$-QAM macrocell is amenable to being fabricated as a single microwave monolithic integrated circuit (MMIC) or integrated circuit (IC). As such, a QAM circuit can be formed from two MMICs; the $2^N$-QAM macrocell and a quadrature hybrid phase shifting device formed on separate MMIC to form a $2^N$-QAM circuit or one MMIC containing both the 0/90 degree phase shifter and the $2^N$-QAM circuit. The phase shifting device is used to provide the in-phase and quadrature phase components of the local oscillator signal. Since the QAM circuit in accordance with the present invention only requires one or two MMIC chips; the complexity and cost of the circuit is reduced and the need for tuning is obviated. The $2^N$-QAM macrocell may be formed from Gilbert transconductance multipliers with GaAs heterojunction bipolar transistor (HBT) technology, thus providing maximum symbol rates in excess of 1 Gsps.

11 Claims, 3 Drawing Sheets

OTHER PUBLICATIONS

A. Boveda et al., "GaAs Monolithic Single–chip Transceiver", 1995 Digest of Papers, Microwave and Millimeter–Wave Monolithic Circuit Sumposium, IEEE 1995, pp. 31–34.*

S. Nam et al., "A 60GHz 256 QAM Balanced Vector Modulator for Short Range LOS Communication Applications", 1998, IEEE Journal of RF IC Symposium, pp. 215–218.*

Huainan Ma et al., "A GaAs Upcoverter MMIC with an Automatic Gain Control Amplifier for 1.9 GHz PHS", IEEE Journal of Solid–State Circuits, vol. 33, No. 9, pp. 1297–1305, Sep. 1998.*

Toshihiko et al., "An HBT MMIC Power Amplifier with an Integrated Diode Linearizer for Low–Voltage Portable Phone Applications", IEEE Journal of Solid–State Circuits, vol. 33, No. 9, pp. 1290–1296, Sep. 1998.*

J.S. Wight et al., "Design of a Ka–Band Up–Converter using Heterojunction Bipolar Transistor", IEEE 1996, Canadian Conference on Electrical and Electronics Engineering, pp. 863–865.*

* cited by examiner

$2^N$-QAM MACROCELL

CROSS-REFERENCE TO RELATED APPLICATIONS

BACKGROUND OF THE INVENTION

1. Field of the Invention

The present invention relates to a quadrature amplitude modulation (QAM) circuit and more particularly to a QAM circuit which utilizes current signal processing which makes it amenable to being formed as a microwave monolithic integrated circuit (MMIC) or integrated circuit (IC) thus reducing the part count and complexity of the circuit while providing a relatively higher symbol rate than known QAM circuits.

2. Description of the Prior Art

Various modulation techniques are known for modulating a carrier signal with various types of information. Due to limited bandwidth allocations in some applications, modulation techniques have been developed to increase the amount of information that can be transmitted per frequency. One such technique is known as quadrature phase shift keying (QPSK). Such QPSK modulation techniques are known in the art and described in U.S. Pat. Nos.: 5,440,259; 5,615,230; 5,440,268; 5,550,868; 5,598,441; 5,500,876 and 5,485,489; hereby incorporated by reference. In general, in such a modulation technique, the phase of both the real and quadrature components of a carrier are modulated in order to enable two bits, each having two states, to be transmitted over a single frequency. As such, at each frequency, the carrier can be modulated into one of four different phase states, known as symbols, which form a constellation as generally shown in FIG. 1A. The QPSK modulation technique is thus able to provide twice the information per frequency relative to conventional amplitude and frequency modulation techniques such as BPSK, making it suitable for applications where bandwidth allocations are relatively limited as in, for example, satellite communications systems.

In order to further increase the amount of information transmitted per frequency, other modulation techniques have been developed, such as quadrature amplitude modulation (QAM). Such QAM modulation techniques are relatively well known in the art. Examples of such QAM modulation circuits are disclosed in U.S. Pat. Nos.: 5,612,651; 5,343,499; 5,363,408; and 5,307,377; hereby incorporated by reference. Such QAM modulation techniques essentially involve amplitude modulation of a QPSK signal to provide constellations of symbols of 8, 16, 32 and 64 and more per frequency, for example, as illustrated in FIG. 1B.

A known QAM modulation circuit is shown in FIG. 2 and generally identified by the reference numeral 20 and disclosed in, S. Nam, A. E. Ashtiani, I. D. Robertson, S. Lucyszyn, Micorwaves and RF, April 1998, Vol. 37, No. 4, p. 113, hereby incorporated by reference. The QAM circuit 20 includes a digital mapping chip 22, a phase shifter 24, and a variable attenuator 26. The QAM circuit 20 is adapted to generate a constellation of $2^N$ symbols, where N is the number of bits in the data word applied to the digital mapping chip 22. As shown, in FIG. 2, N=6, therefore the QAM circuit 20 is adapted to provide a constellation of 64 symbols. The N bit wide data word is applied to the digital mapping chip, typically an application specific integrated circuit (ASIC), which, in turn, provides signals to the phase shifter 24 and variable attenuator 26 to provide the desired constellation. The output of the QAM circuit 20 is an RF signal at the local oscillator (LO) frequency that during a symbol period, 1/R, where R is the data symbol rate, has an amplitude and phase that corresponds to a specific transmitted word. Demodulators on the receiving end operate by measuring the RF carrier amplitude and phase during a symbol period and performing a reverse mapping operation.

The QAM circuit architecture illustrated in FIG. 2 is relatively simple in nature since it requires very few devices to implement and is known to be low in power consumption. Unfortunately, the symbol transfer rate is known to be limited by the speed of the phase shifter 24 and the variable attenuator 26, currently in the 100 ksps range (100,000 symbols per second), making the system unsuitable for high data rate applications in the millimeter wave bands including the recently allocated 38 GHz band. Another disadvantage of the system illustrated in FIG. 2, is the requirement of a separate digital mapping chip.

FIG. 3 illustrates a QAM circuit which utilizes a commercially available I-Q modulator, along with a digital mapping circuit and a pair of digital to analog converters (DAC) 34 and 36. As discussed in detail by W. H. Pratt in RF Design, 1994, the I-Q modulator 30 provides relatively improved performance and combines the variable attenuator and phase shifter used in the architecture illustrated in FIG. 2 on a single monolithic device. More particularly, the I-Q modulator 30 may utilize Gilbert transconductance cells formed from GaAs or InP heterojunction bipolar transistor (HBT) technology, thus providing relatively higher symbol rates, for example, up to about 100 Msps. Unfortunately, the QAM circuit 28 requires a digital mapping chip 32 and pair of DACs 34 and 36; both of which consume a relatively large amount of power for high symbol rate applications(i.e. 1–3 watts each).

In order to provide an increased symbol rate for use in the higher frequency bands and eliminate the need for the mapping circuit and DACs, a wideband QAM circuit 40 as illustrated in FIG. 4 has been developed. The QAM circuit 40 provides a relatively higher symbol rate, in excess of one giga symbol per second (1 Gsps), utilizing wide bandwidth double-balanced diode mixer in the multiplier sections. As can be seen from FIG. 4, the QAM circuit 40 enables the digital data word ($D_0$, $D_1$, $D_3$, $D_4$ and $D_5$) to be fed directly into the multipliers 42–47, thus eliminating a digital mapping chip. The QAM circuit 40 also eliminates the need for DACs, thus reducing the power consumption of the circuit. Unfortunately, the QAM circuit 40 requires a relatively larger number of discrete components to implement. For example, the 64 QAM modulator illustrated in FIG. 4 requires 10–20 discrete devices, making the modulator 40 relatively complex and expensive to implement. Another disadvantage of the QAM modulator 40 is that it requires extensive tuning to correct for errors produced in the manufacturing processes of the discrete devices as well as circuit interactions.

SUMMARY OF THE INVENTION

It is an object of the present invention to solve various problems in the prior art.

It is yet another object of the present invention to provide a quadrature amplitude modulation (QAM) circuit which provides increased symbol rates.

It is yet a further object of the present invention to provide a QAM circuit that is amenable to be formed on a single microwave monolithic integrated circuit (MMIC) or integrated circuit (IC).

It is yet a further object of the present invention to provide a QAM circuit with reduced power consumption.

Briefly, the present invention relates to a $2^N$-QAM integrated macrocell for generating constellations with $2^N$ symbols, where N is the number of bits in the digital data word $[D_0:D_{N-1}]$ applied to the integrated macrocell. Since the digital data word is applied directly to the integrated macrocell, the need for a digital mapping chip is eliminated thus reducing the complexity and power consumption of the circuit. An important aspect of the invention is that the $2^N$-QAM integrated macrocell is amenable to being fabricated as a single microwave monolithic integrated circuit (MMIC) or integrated circuit (IC). As such, a QAM circuit can be formed from one or two MMICs; the $2^N$-QAM macrocell and a quadrature phase shifting device formed on the same MMIC or a separate MMIC to form a complete $2^N$-QAM circuit. For lower frequency applications (<1 GHz) the QAM circuit can also be formed on a single IC, using standard silicon BJT processes. The phase shifting device is used to provide the in-phase and quadrature phase components of the local oscillator signal and may be realized using passive or active structures. Since the QAM circuit, in accordance with the present invention, only requires one or two MMIC chips; the complexity and cost of the circuit is reduced and the need for tuning is obviated as a result of the inhernet accuracy and stability of the monolithic process used to fabricate the circuit. The $2^N$-QAM macrocell may be formed from Gilbert transconductance multipliers with GaAs or InP heterojunction bipolar transistor (HBT) technology, thus providing symbol rates in excess of 1 Gsps. Due to their small size, these structures enable very high levels of functional integration. For applications where the carrier frequency is below 1 GHz, and data rates are below 10 Mbps, conventional Si bipolar processes can be used.

BRIEF DESCRIPTION OF THE DRAWINGS

These and other objects of the present invention will be readily understood with reference to the following specification and attached drawing, wherein.

DETAILED DESCRIPTION OF THE INVENTION

The present invention relates to a $2^N$ quadrature amplitude modulation (QAM) circuit, where N equals the number of bits in the digital word applied to the modulator. As shown and described herein, a 6 bit digital word $[D_0:D_5]$ is illustrated which provides a 64 symbol constellation. It should be appreciated by those of ordinary skill in the art that N can be more or less than 6 for modulators with constellations having different numbers of symbols. An important aspect of the present invention is that it enables increased symbol rates relative to known QAM systems, for example, symbol rates around 1 Gsps. In addition to providing increased symbol rates, the system in accordance with the present invention does not require tuning and is of relatively low implementation complexity.

Figure 5:
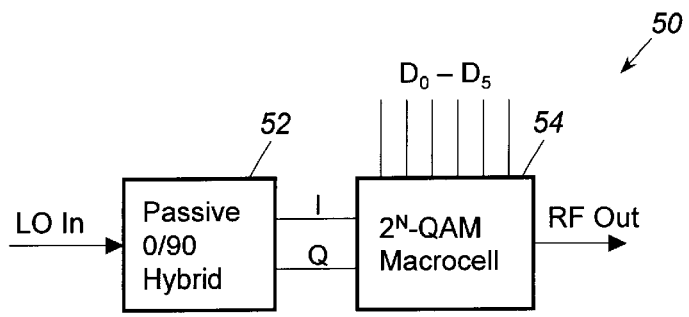
FIG. 5 is a block diagram of a $2^N$-QAM modulator in accordance with the present invention.

With reference to FIG. 5, the $2^N$-QAM circuit, in accordance with the present invention is illustrated and generally identified with the reference numeral 50. As shown, the QAM circuit 50 may be implemented with relatively few microwave monolithic integrated circuit (MMIC) or integrated circuit (IC) chips. In particular, the QAM circuit 50, may be formed from two MMICs 52 and 54 or they may be combined into one MMIC. Circuit 52 is a quadrature phase shifting circuit, for example, as disclosed in J. Lange, IEEE Transactions on Microwave Theory and Techniques, p. 1150, December 1969, herein and incorporated by reference. A local oscillator input signal (LO In) is applied to the circuit 52. Circuit 52 splits the local oscillator input signal (LO In) into an in-phase component (I) and a quadrature component (Q) in a known manner. The I and Q components of the local oscillator input signal (LO In) are applied to circuit 54. The circuit 54 is a $2^N$-QAM structure in accordance with the present invention. The digital word $[D_0:D_5]$ is applied directly to the $2^N$-QAM circuit 54, thus eliminating the need for a digital mapping chip as discussed above. Also, the need for digital to analog converters (DAC's) are not required since, as will be discussed below, the digital data words are applied directly to the multiplier within circuit 54. In order to provide increased symbol rates, the circuit 54 is formed with Gilbert transconductance multipliers with GaAs heterojunction bipolar transistor (HBT) technology which enables symbol rates greater than 1 Gsps.

Figure 1A:
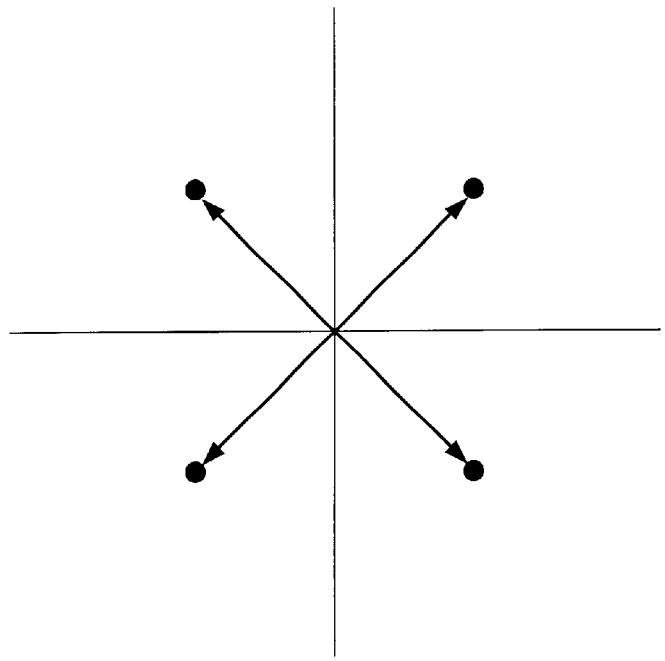
FIG. 1A is a diagram illustrating a constellation for typical QPSK modulator.
Figure 1B:
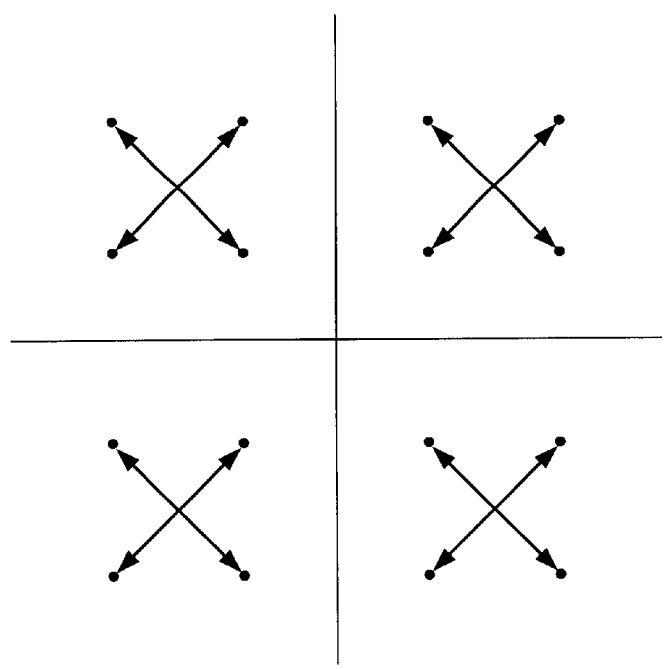
FIG. 1B is a diagram illustrating a constellation for a 16 QAM modulator.
Figure 2:
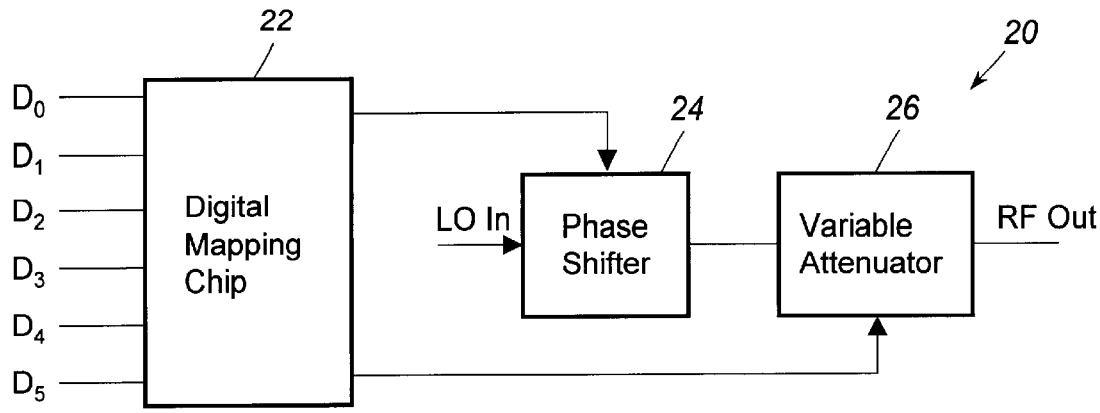
FIG. 2 is a block diagrams of a known 64-QAM system.
Figure 3:
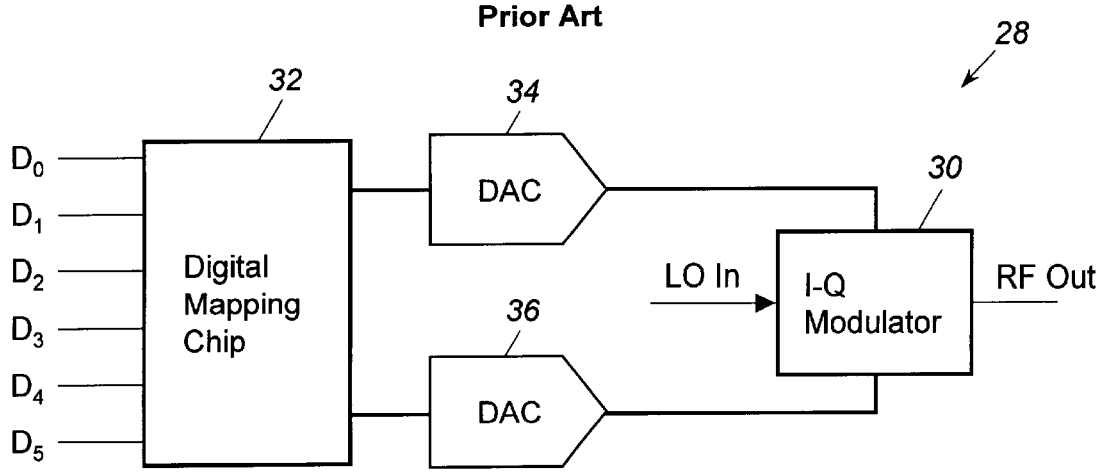
FIG. 3 is a block diagram of another 64-QAM system which utilizes gilbert cell technology to provide an increase symbol per second rate.
Figure 4:
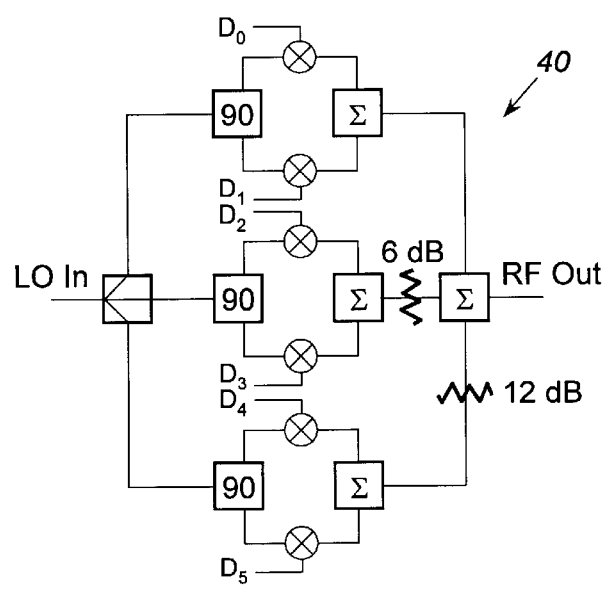
FIG. 4 is a block diagram of a wideband 64-QAM modulator.
Figure 6:
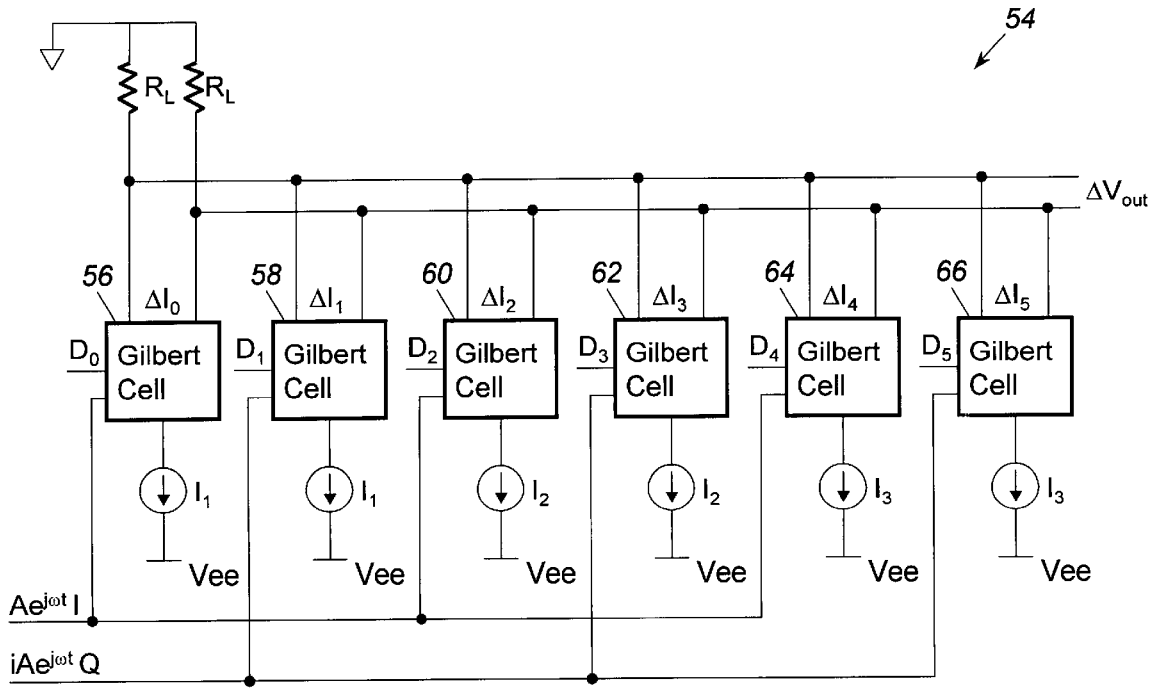
FIG. 6 is a block diagram of a $2^N$-QAM macrocell in accordance with the present invention which forms a part of the $2^N$-QAM system illustrated in FIG. 5.

A detailed block diagram of circuit 54 of FIG. 5 is illustrated in FIG. 6. An important aspect of the $2^N$-QAM circuit 54 is the use of current mode technology, signal processing is performed on signal currents as opposed to voltages. The use of current mode technologies provide increased performance characteristics including broad bandwidth, good matching between I and Q channels, and predictable phase response. The I-Q modulator shown in FIG. 3 uses a similar current mode approach to perform the I-Q vector modulations. The $2^N$-QAM macrocell in accordance with the present invention provides increased advantages for QAM modulations over the I-Q modulator illustrated in FIG. 3 in that the QAM macrocell 54 does not require a digital mapping circuit or DACs, thus reducing the complexity and power consumption of the circuit. Other important aspects of the present invention are that the $2^N$-QAM macrocell 54 is amenable to being fabricated using GaAs or In P HBT technology and does not require good linearity in the Gilbert cell multiplier stages.

Referring to FIG. 6, the $2^N$-QAM circuit 54, includes N Gilbert cell transconductance multipliers 56–66. In the exemplary embodiment, illustrated in FIG. 6, six Gilbert cell transconductance multipliers 56, 58, 60, 62, 64 and 66 are illustrated to form a 64 symbol constellation. However, it is to be understood that N can be more or less than 6 to form constellations with different number of symbols. Additional Gilbert cell transconductance multipliers can be added to provide higher order modulation outputs with the only limitation being the accuracy of the monolithic process used to fabricate the device. Such Gilbert cell transconductors multipliers are well known in the art and are disclosed in B. Gilbert, IEEE Journal of Solid State Circuits, Vol. SC-9, p. 364, December, 1974, hereby incorporated by reference. The digital data word $[D_0:D_5]$ is applied directly to the Gilbert cell transconductance multipliers 56–66, thus eliminating the need for a digital signal mapping chip and DACs. The Gilbert cell transconductance multipliers 56–66 produce a differential current that is proportional to the product of the two inputs. More particularly, as shown in FIG. 6, either an in-phase component I or a quadrature phase component Q is applied to each of the Gilbert cell transconductance multipliers 56, 66. More particularly, the in-phase I component of the local oscillator (LO In) signal is applied to the Gilbert cells 56, 60 and 64, while the quadrature phase Q component of the local oscillator signal LO In is applied to the Gilbert cell transconductance multipliers 58, 62 and 66.

As shown, each of the Gilbert cell transconductance multipliers 56–66 is connected to a current source. Essentially identical current sources are applied each of the Gilbert cell pairs 56/58, 60/62 and 64/66; each Gilbert cell pair 56/58, 60/62 and 64/66 receiving an in-phase I component and a quadrature phase Q component of the local oscillator signal LO In. Thus, as shown in FIG. 6, a current source $I_1$ is connected to the Gilbert cells 56 and 58. Similarly, a current source $I_2$ is connected to the Gilbert cells 60 and 62 while a current source $I_3$ is connected to the Gilbert 64 and 66. Each of the current sources $I_1$, $I_2$ and $I_3$ may be formed in a known manner, for example, by connecting a resistor to an external voltage Vee.

The Gilbert cell multipliers 56–66 produce a differential current that is proportional to the product of the two inputs, multiplied by the value of the particular data bit, $[D_0:D_5]$. As mentioned above, the in-phase I and quadrature phase Q components of the local oscillator signal LO In are provided by a quadrature phase shifting circuit or MMIC 52. The in-phase component (I) has the general form $Ae^{j\omega t}$, whereas the quadrature phase component (Q) has the general form $Ae^{j\omega t+j\pi/2}$. The quadrature phase component can be simplified to be $jAe^{j\omega t}$. For-non-return-to-zero (NRZ) data streams the differential currents at $\Delta I_0 - \Delta I_5$ at the outputs of the Gilbert multipliers 56–66 are provided in equations 1–6.

$$\Delta I_0 = AD_0 I_1 e^{j\omega t} \quad (1)$$

$$\Delta I_1 = jAD_1 I_1 e^{j\omega t} \quad (2)$$

$$\Delta I_2 = AD_2 I_2 e^{j\omega t} \quad (3)$$

$$\Delta I_3 = jAD_3 I_2 e^{j\omega t} \quad (4)$$

$$\Delta I_4 = AD_4 I_3 e^{j\omega t} \quad (5)$$

$$\Delta I_5 = jAD_5 I_3 e^{j\omega t} \quad (6)$$

Since the circuit is a monolithic circuit, the current for each of the $I_2$ current sources can be one half that of the $I_1$ current sources. Similarly, each of the $I_3$ current sources can be made to be one fourth of the current of the $I_1$ current source resulting in the following Eq. 7.

$$I_1 = 2I_2 = 4I_3 \quad (7)$$

Since the Gilbert cell transconductance multipliers 56–66 are all effectively summed, the total differential current $\Delta I_{tot}$ is given by Eq. 8.

$$\Delta I_{tot} = \Delta I_0 + \Delta I_1 + \Delta I_2 + \Delta I_3 + \Delta I_4 + \Delta I_5 \quad (8)$$

After substituting Eq. 1–7, factoring out like terms, the total differential current $\Delta I_{tot}$ is provided by Eq. 9 below.

$$\Delta I_{tot} = AI_1 e^{j\omega t}\{(D_0 + D_2/2 + D_4/4) + j(D_1 + D_3/2 + D_5/4)\} \quad (9)$$

The total differential current $\Delta I_{tot}$ is dropped across a load resistor $R_L$, resulting in differential voltage output $\Delta V_{out}$ is given in Eq. 10 below.

$$\Delta V_{out} \equiv \left\{ 2R_L AI_1 \sqrt{(D_0 + D_2/2 + D_4/4)^2 + (D_1 + D_3/2 + D_5/4)^2} \right\} \quad (10)$$

$$e^{j\omega t + j\tan^{-1}\left(\frac{D_1 + D_3/2 + D_5/4}{D_0 + D_2/2 + D_4/4}\right)}$$

$\Delta V_{out}$ is the modulated RF output waveform at the local oscillator frequency $\omega$ that contains the digital data. As shown, the output $\Delta V_{out}$ is a function of the current $I_1$, the load resistor $R_L$ as well as the digital data $[D_0:D_5]$.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A quadrature amplitude modulation (QAM) circuit for generating constellations having $2^N$ symbols, where N equals the number of bits in a digital data word applied to said circuit, the QAM circuit comprising:

first means for generating in-phase I and quadrature phase Q components of a local oscillator signal; and second means for generating a constellation having $2^N$ symbols, wherein said second means includes a plurality of multipliers and current sources and is responsive to said in-phase and quadrature phase components of said local oscillator signal being applied to said multipliers and said digital data word.

2. A quadrature amplitude modulation (QAM) circuit for generating constellations having $2^N$ symbols, where N equals the number of bits in a digital data word applied to said circuit, the QAM circuit comprising:

first means, formed as a microwave monolithic integrated circuit (MMIC), for generating in-phase I and quadrature Q phase components of a local oscillator signal; and second means for generating a constellation having $2^N$ symbols, wherein said second means includes a plurality of multipliers and current sources and is responsive to said in-phase and quadrature phase components of said local oscillator signal being applied to said multipliers and said digital data word.

3. The QAM circuit as recited in claim 2, wherein said second means is formed as a monolithic circuit.

4. A quadrature amplitude modulation (QAM) circuit for generating constellations having $2^N$ symbols, where N equals the number of bits in a digital data word applied to said circuit, the QAM circuit comprising:

first means for generating in-phase I and quadrature Q phase components of a local oscillator signal; and second means for generating a constellation having $2^N$ symbols, wherein said second means includes N multipliers defining multiple pairs of multipliers and current sources, each multiplier having a differential output and being responsive to said in-phase and quadrature phase components of said local oscillator signal being applied to said multipliers and said digital data word.

5. A quadrature amplitude modulation (QAM) circuit for generating constellations having $2^N$ symbols, where N equals the number of bits in a digital data word applied to said circuit, the QAM circuit comprising:

first means for generating in-phase I and quadrature Q phase components of a local oscillator signal; and second means for generating a constellation having $2^N$ symbols, wherein said second means includes N multipliers defining multiple pairs of multipliers and current sources, each multiplier having a differential output and being responsive to said in-phase and quadrature phase components of said local oscillator signal being applied to said multipliers and said digital data word, each multiplier being connected to a current source and adapted to have a load resistance connected across its differential output and is responsive to one of said N bits applied thereto.

6. The QAM circuit as recited in claim 5, wherein said multipliers are Gilbert cell transconductance multipliers.

7. A quadrature amplitude modulation (QAM) circuit for generating constellations having $2^N$ symbols, where N equals the number of bits in a digital data word applied to said circuit, the QAM circuit comprising:

first means for generating in-phase I and quadrature Q phase components of a local oscillator signal; and second means for generating a constellation having $2^N$ symbols, wherein said second means includes N multipliers defining multiple pairs of multipliers and current sources, each multiplier having a differential output and being responsive to said in-phase and quadrature phase components of said local oscillator signal being applied to said multipliers and said digital data word, each pair of multipliers being connected to a different current source and an in-phase I component of said local oscillator signal is applied to one of said multipliers in each of said pairs and a quadrature phase Q component of said local oscillator signal is applied to the other of said multipliers in each of said pair.

8. A quadrature amplitude modulation (QAM) macrocell for use in QAM circuit which is responsive to in-phase I and quadrature phase Q components of a local oscillator signal for generating constellations having $2^N$ symbols, where N equals the number of bits in a digital word applied to said macrocell, the QAM macrocell comprising:

N multipliers defining N/2 multiple pairs of multipliers, each multiplier having a differential output, one bit of said N bit digital word adapted to be applied to each of said multipliers; and a plurality of current sources wherein each pair of multipliers is connected to the same current source and said multiple pairs are connected to different current sources, wherein an in-phase I components is connected to one multiplier in each of said pairs of multipliers and a quadrature phase Q component is connected to the other multiplier in each of said N/2 pairs of multipliers.

9. The QAM circuit as recited in claim 8, wherein one or more of said multipliers are Gilbert cells.

10. The QAM circuit as recited in claim 8, wherein said macrocell is formed from heterojunction bipolar transistor (HBT) technology.

11. The QAM circuit as recited in claim 9, wherein said macrocell is formed as a microwave monolithic integrated circuit (MMIC).

\* \* \* \* \*